(12) United States Patent  
Hobbet et al.

(10) Patent No.: US 8,904,085 B2
(45) Date of Patent: Dec. 2, 2014

(54) SOLID-STATE MEMORY MANAGEMENT (75) Inventors: Jeffrey R. Hobbet, Holly Springs, NC (US); Takashi Sugawara, Tokyo (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 735 days.

(21) Appl. No.: 12/687,394

(22) Filed: Jan. 14, 2010

(65) Prior Publication Data

US 2011/0173374 A1    Jul. 14, 2011

(51) Int. Cl.
*G06F 12/00* (2006.01)
*G06F 1/28* (2006.01)
*G11C 16/30* (2006.01)

(52) U.S. Cl.
CPC . *G06F 1/28* (2013.01); *G11C 16/30* (2013.01)
USPC .......................................... 711/103; 365/226

(58) Field of Classification Search
None
See application file for complete search history.

(56) References Cited

U.S. PATENT DOCUMENTS

| | | | |
|---|---|---|---|
| 5,889,721 A * | 3/1999 | Gannage | 365/226 |
| 7,315,484 B2 * | 1/2008 | Yang et al. | 365/226 |
| 2002/0181311 A1 * | 12/2002 | Miyauchi | 365/227 |
| 2003/0086302 A1 * | 5/2003 | Kurakata et al. | 365/189.02 |
| 2004/0027855 A1 * | 2/2004 | Kleveland et al. | 365/185.11 |
| 2004/0049628 A1 * | 3/2004 | Lin et al. | 711/103 |
| 2005/0242786 A1 * | 11/2005 | Sawyers et al. | 323/211 |
| 2007/0055821 A1 * | 3/2007 | Ootsuka et al. | 711/115 |
| 2007/0058464 A1 * | 3/2007 | Nakanishi | 365/200 |
| 2007/0211551 A1 * | 9/2007 | Yogev et al. | 365/226 |
| 2008/0140919 A1 * | 6/2008 | Torabi et al. | 711/103 |
| 2010/0034042 A1 * | 2/2010 | Ben-Rubi | 365/226 |
| 2010/0036998 A1 * | 2/2010 | Ben-Rubi | 711/100 |
| 2010/0268974 A1 * | 10/2010 | Floyd et al. | 713/340 |
| 2010/0292854 A1 * | 11/2010 | Burg et al. | 700/291 |
| 2010/0332741 A1 * | 12/2010 | Cornwell et al. | 711/103 |
| 2011/0060932 A1 * | 3/2011 | Conroy et al. | 713/340 |

* cited by examiner

*Primary Examiner* — Kaushikkumar Patel (74) *Attorney, Agent, or Firm* — Brian J. Pangrle (57) ABSTRACT

An exemplary method includes performing flash memory operations; receiving a signal from a voltage monitor as being associated with the performed flash memory operations; and, based at least in part on the received signal, setting a limit for performing subsequent flash memory operations. In such a method, the limit can act to avoid resetting flash memory responsive to current demand associated with subsequent flash memory operations. Various other apparatuses, systems, methods, etc., are also disclosed.

13 Claims, 8 Drawing Sheets

SOLID-STATE MEMORY MANAGEMENT

TECHNICAL FIELD

Subject matter disclosed herein generally relates to techniques for managing solid-state memory.

BACKGROUND

Solid-state memory has led to the development of so-called Solid-State Drives (SSDs). SSDs can replace or supplement other types of drives such as electromechanical drives. In comparison to an electromechanical drive, a SSD may provide faster read/write times, less noise, less power consumption and greater reliability (e.g., shock, temperature, etc.). With respect to data writing and data reading, further improvements over electromechanical drives can be made through various controller architectures that increase parallelism. For example, a SSD NAND controller may include a number of channels that allow for simultaneous control of individual NAND chips. Such approaches allow for faster performance and can be beneficial as bus speeds increase (consider, e.g., a 6 Gbps Serial ATA bus).

As discussed below, various issues can arise during use of solid-state memory. Some of these issues can make certain approaches to increasing performance counterproductive. As described herein, various exemplary technologies can address such issues and help ensure that efforts to increase performance of SSDs can be realized.

SUMMARY

An exemplary method includes performing flash memory operations; receiving a signal from a voltage monitor as being associated with the performed flash memory operations; and, based at least in part on the received signal, setting a limit for performing subsequent flash memory operations. In such a method, the limit can act to avoid resetting flash memory responsive to current demand associated with subsequent flash memory operations. Various other apparatuses, systems, methods, etc., are also disclosed.

BRIEF DESCRIPTION OF THE DRAWINGS

Features and advantages of the described implementations can be more readily understood by reference to the following description taken in conjunction with the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Figure 1:
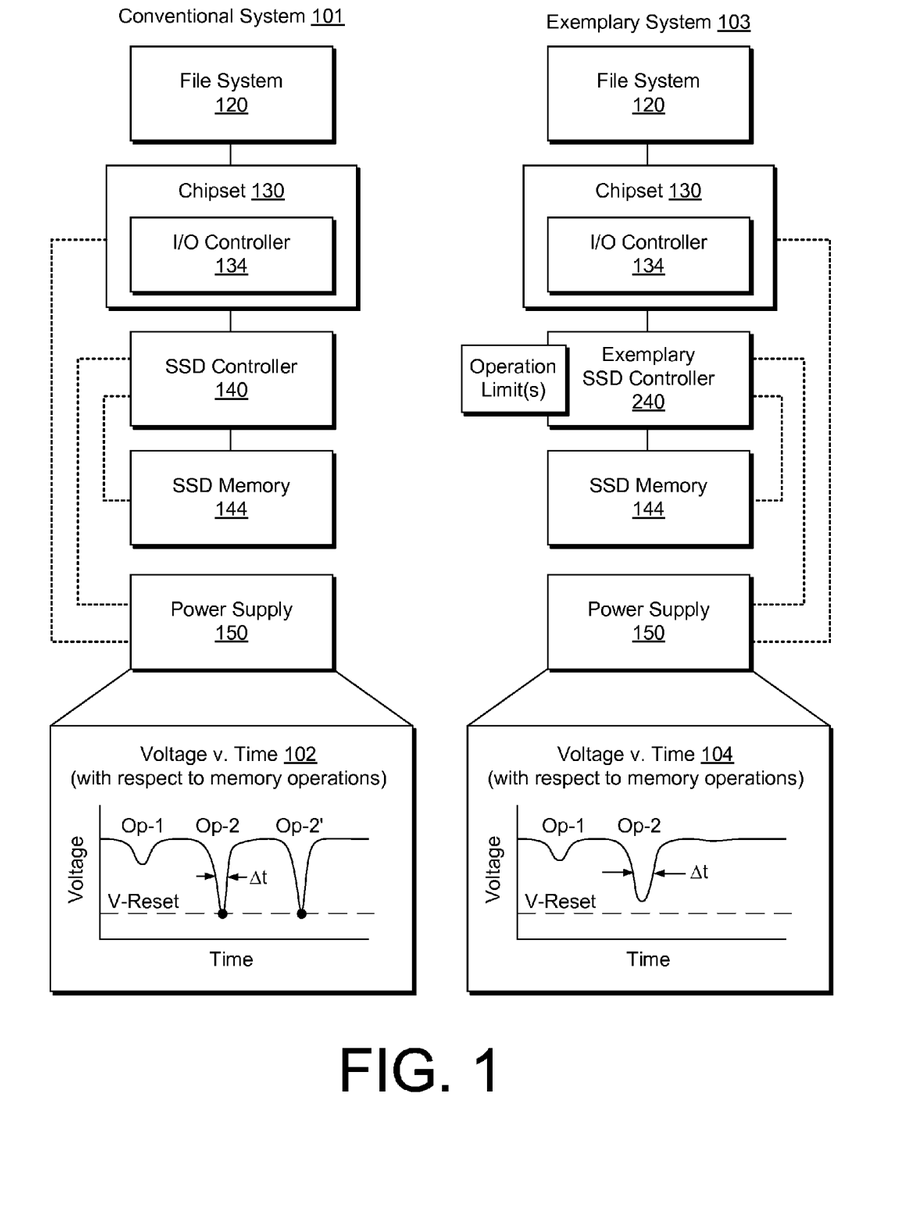
FIG. 1 is a diagram of a conventional system and an exemplary system where the exemplary system is configured to avoid voltage droops that could trigger a reset.

FIG. 1 shows a conventional system 101 and an exemplary system 103 along with corresponding plots 102, 104 of voltage with respect to time. The system 101 includes a file system 120, a chipset 130 with an I/O controller 134, a SSD controller 140, SSD memory 144 and a power supply 150. The foregoing components 120-150 may be found in any of a variety of conventional systems (e.g., notebook computers, portable media players, cell phones, etc.).

With respect to the power supply 150, the relationship between power (P), current (i) and voltage (V) may be represented as $P=i^2R$ or $P=iV$; thus, for a limited amount of power (P), voltage (V) will drop (or droop) responsive to an increase in current (i). While various power supplies (e.g., batteries) are configured to provide a relatively constant voltage for a certain amount of current drain (e.g., a constant voltage for current drains of ~3000 mA), once the current drain exceeds that amount (e.g., due to increased demand or load), voltage will droop.

As indicated in the plot 102, certain types of memory operations (Op-1, Op-2, Op-2') associated with the SSD memory 144 may drain current in a manner that causes voltage of the power supply 150 to droop (e.g., whether from a positive or negative value). For example, memory operations for copying a large file to SSD memory may demand over 500 mA of current, especially where the SSD controller and the SSD memory are configured for highly parallel operations (e.g., to increase speed). As most SSD controllers and SSD memory require a certain voltage or voltages for operation, if voltage droops below a certain level, a reset can occur (e.g., a power-on reset).

Further, while a SSD controller and SSD memory may have a maximum current drain rating (e.g., around 700 mA), this factor alone cannot prevent occurrence of voltage droops that can trigger resets. For example, consider a scenario with a removable SSD controller and SSD memory where one system has a power supply rated to maintain a constant voltage up to ~5000 mA and another system that has a power supply rated to maintain a constant voltage up to ~3000 mA. In this example, the removable SSD controller and SSD memory may operate without reset in the first system but encounter resets in the second system. While total current demand from all system components (including attached devices such as USB devices, etc.) contribute to a droop in voltage, it is the instantaneous nature of SSD memory operations that can quickly increase current drain and lead to droops sufficient to trigger a reset. Thus, in the foregoing example, memory operations may cause a reset in the first system and not in the second system. Accordingly, the risk of a reset due responsive to a droop in voltage can depend on many system factors.

Referring again to the plot 102, the operation Op-2 is shown as causing a voltage droop sufficient to trigger a reset (see, e.g., reset threshold V-Reset). In the scenario shown, the reset terminates the operation (Op-2) and, after a successful reset, a retry occurs for the operation (Op-2'), which again triggers a reset. Such scenarios slow processes that rely on the called for memory operations and defeat speed gains derived via increased parallelism.

To mitigate the reset issue described with respect to the plot 102, the system 103 includes an exemplary SSD controller 240. In the example of FIG. 1, the SSD controller 240 sets one or more operation limits based on execution of one or more test protocols and associated voltage monitoring. Accordingly, the SSD controller 240 acts to avoid memory operations that could trigger a reset (e.g., in a manner that can optionally account for various system factors). Depending on the nature of the operations, a trade-off may occur whereby particular operations for a task occur over a slightly longer period of time when compared to operations for the same task using a conventional SSD controller (see, e.g., Δt associated with Op-2 in the plots 102, 104). Often, such a delay is preferred to a reset.

Figure 2:
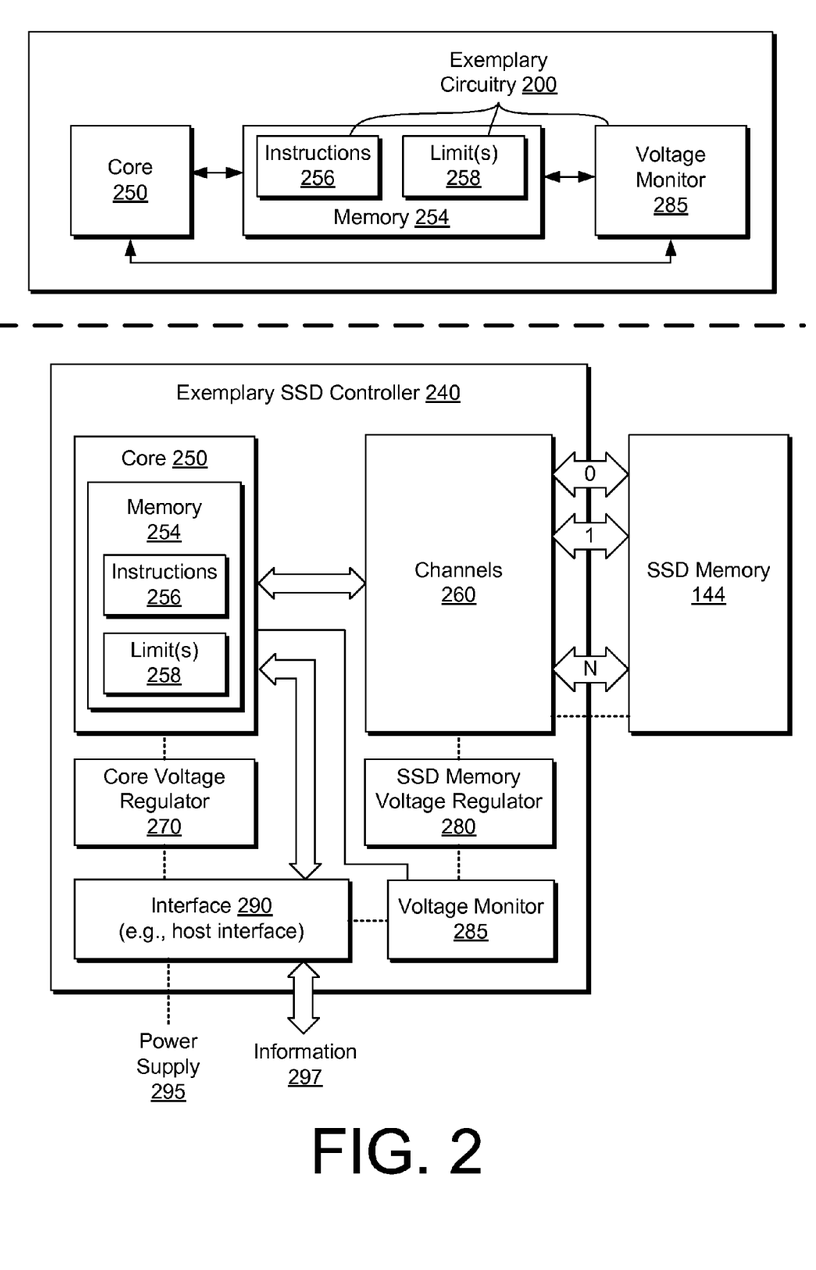
FIG. 2 is a diagram of exemplary circuitry and an exemplary SSD controller.

FIG. 2 shows exemplary circuitry 200 and an example of the exemplary SSD controller 240 of FIG. 1. To aid in description of the circuitry 200, a core 250 and associated memory 254 are shown (e.g., ROM, RAM, etc.). Instructions 256 are stored in the memory 254 where execution of the instructions 256 occurs via the core 250. The memory 254 may be configured to store write data to be written to the SSD memory 144 and to store read data read from the SSD memory 144. A voltage monitoring circuitry 285 is also shown. According to the example of FIG. 2, the instructions 256 cause certain memory operations to be performed while the voltage monitoring circuitry 285 monitors a supply voltage. Based on feedback, or lack thereof, from the voltage monitoring circuitry 285, one or more limits 258 are set to restrict certain memory operations.

In the example of FIG. 2, the SSD controller 240 includes the exemplary circuitry 200 as well as other circuitry. Specifically, the SSD controller 240 includes the core 250, memory 254, instructions 256, one or more limits 258, channels 260, a core voltage regulator 270, a SSD memory voltage regulator 280, the voltage monitoring circuitry 285, and an interface 290 to receive power from one or more power supply lines 295 and to receive and transmit information via one or more information lines 297. As shown in FIG. 2, the SSD controller 240 is operably configured to control the SSD memory 144 via the various channels 260 (e.g., 0, 1, 2, . . . N). In such an example, N may be an appropriate integer (e.g., 8, 16, etc.); noting that a higher number of channels typically corresponds to an increased ability to perform operations in parallel. In the example of FIG. 2, each channel of the channels 260 may include associated buffer memory for performing read or write operations for that channel. Other circuitry may be included in the controller 240 to assist with various operations (e.g., error correcting code, wear leveling, translation layers, etc.).

Often flash memory is organized into pages where each page is further divided into sectors. For example, a page may include multiple sectors (e.g., 8 sectors) and may be part of a super page (e.g., 32 sectors). Sectors of a super page may be operated on (e.g., read, write, erase) via multiple channels simultaneously. As described herein, multichannel operations that occur over a short period of time (e.g., substantially simultaneously) can cause a significant current drain. Where an overall current drain exceeds a certain level, a power supply may not be able to maintain a particular desired voltage. In turn, a drop in voltage (or droop) can trigger a shutdown or reset (e.g., power-on) of solid-state memory. For example, a super page write operation that relies on 4 channels simultaneously may be sufficient to cause a reset, especially if a power supply is already operating near its rated current drain limit (e.g., a limit not to be exceeded to maintain a desired voltage).

In FIG. 2, dashed lines represent power while solid arrows represent, for example, information buses. Further, in the example of FIG. 2, a line exists between the voltage monitoring circuitry 285 and the core 250. Such a line may be a simple binary digital signal, for example, where a "0" represents no droop and a "1" represents droop (or vice versa). In another example, such a line may be configured to indicate a percentage of droop with respect to an acceptable supply voltage and an unacceptable supply voltage (e.g., 00, 01, 10, 11 may correspond to no droop, a 25% droop, a 50% droop and a 75% droop toward the unacceptable voltage).

While the voltage monitoring circuitry 285 is shown in the example of FIG. 2 as being upstream from the SSD memory voltage regulator 280, it may be downstream from the regulator 280, upstream or downstream from the core voltage regulator 270, or upstream or downstream from both regulators 270, 280 (e.g., configured to monitor two different voltages). In instances where a single regulator exists, the voltage monitoring circuitry 285 can be configured to monitor the voltage to or from the regulator. As described herein, voltage monitoring circuitry may be configured to monitor one or more voltages at one or more locations.

Figure 3:
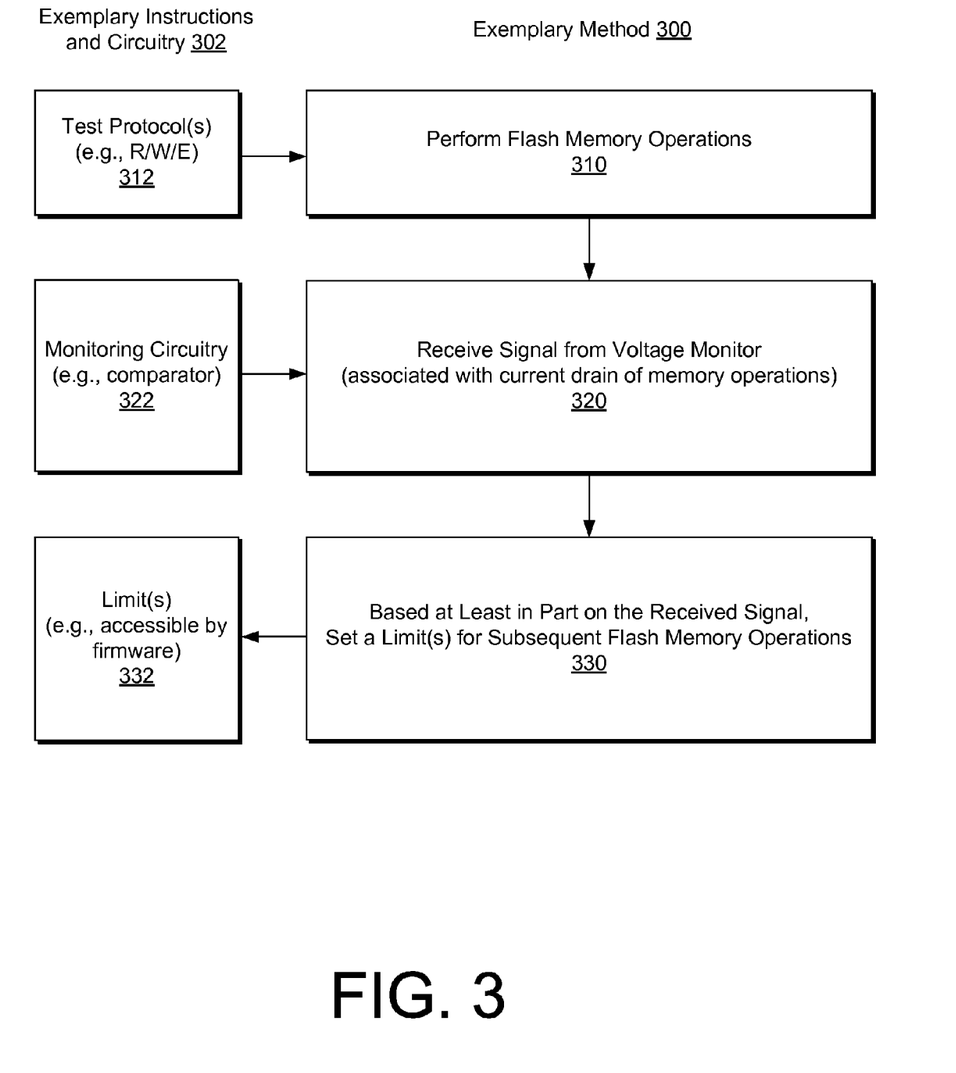
FIG. 3 is a diagram of an exemplary method for limiting memory operations.

FIG. 3 shows an exemplary method 300 and associated instructions and circuitry 302. In a performance block 310, the method performs flash memory operations. As indicated, the operations may be associated with one or more test protocols 312 (e.g., that include read, write or erase operations or combinations thereof). In a reception block 320, a signal is received from a voltage monitor where the signal reflects how the operations of block 310 affect or do not affect a supply voltage. As indicated, the signal may originate at monitoring circuitry 322, which may be a voltage comparator or other circuitry. A comparator or other circuitry for monitoring voltage may be, or include, an op-amp, a dedicated chip with a digital logic interface, etc. In a set block 330, the method 300 includes setting one or more limits for subsequent memory operations based at least in part on the received signal in block 320. As indicated, the one or more limits 332 may be stored in memory, which may be accessible by firmware or other control logic to limit memory operations.

As described herein, an exemplary method includes performing flash memory operations; receiving a signal from a voltage monitor as being associated with the performed flash memory operations; and, based at least in part on the received signal, setting a limit for performing subsequent flash memory operations. In such a method, the limit can avoid resetting the flash memory responsive to current demand for performing subsequent flash memory operations. In such a method, the receiving may receive a signal that indicates a decrease in voltage occurred during the performed flash memory operations.

As described herein, an exemplary method may include accessing one or more test protocols prior to performing flash memory operations (e.g., to determine which memory operations to perform). An exemplary method may include accessing a log of flash memory operations prior to performing the flash memory operations (e.g., to determine which memory operations to perform). An exemplary method may include receiving a digital signal representative of a percentage difference between an acceptable voltage and an unacceptable voltage. In various examples, memory operations are concurrent memory operations, which may give rise to a significant instantaneous current draw. Such operations may be called for via a multi-channel flash memory controller.

As described with respect to FIG. 1, a system includes a power supply 150. Accordingly, an exemplary method may include receiving electrical power from a host device (e.g., to power a SSD). An exemplary method to set one or more limits may include initiating the method responsive to receiving electrical power from a host device. Receipt of power or a power-on may be considered an event; noting that other types of events may initiate or call for repeating a method to set one or more limits. For example, a flash memory reset event or a timed event may call for repeating a method.

Figure 4:
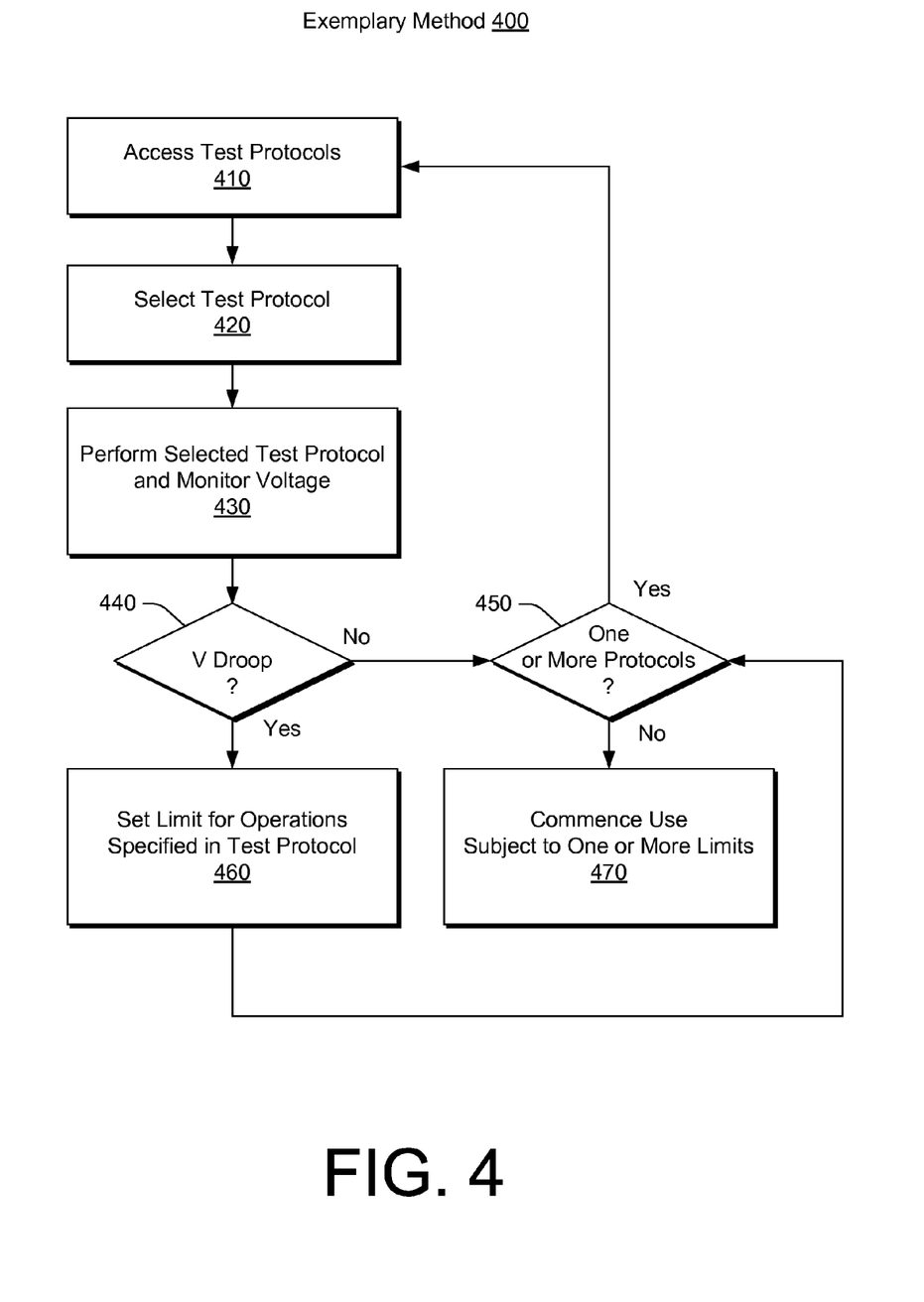
FIG. 4 is a diagram of an exemplary method for limiting memory operations based on one or more test protocols.

FIG. 4 shows an exemplary method 400 for setting one or more limits on memory operations. The method 400 commences in an access block 410 that accesses test protocols. In a selection block 420, a test protocol is selected. A performance block 430 performs the selected test protocol. A decision block 440 follows that decides if a droop occurred in voltage responsive to the performed memory operations. If the decision block 440 decides that a droop did not occur, the method 400 continues at another decision block 450. However, if the decision block 440 decides that a droop did occur, the method continues at a set block 460 that sets a limit for the operations specified in the test protocol. Thereafter, the method 400 continues to the decision block 450.

In the example of FIG. 4, if the decision block 450 decides that one or more protocols should be performed, the method 400 continues to the access block 410. If the decision block 450 decides that no further protocols are required, the method 400 continues to the commencement block 470 to commence use of the memory subject to the one or more limits set per the set block 460. Accordingly, the method 400 may act to set one or more limits for expected types of memory operations that could drop voltage and trigger a reset.

Figure 5:
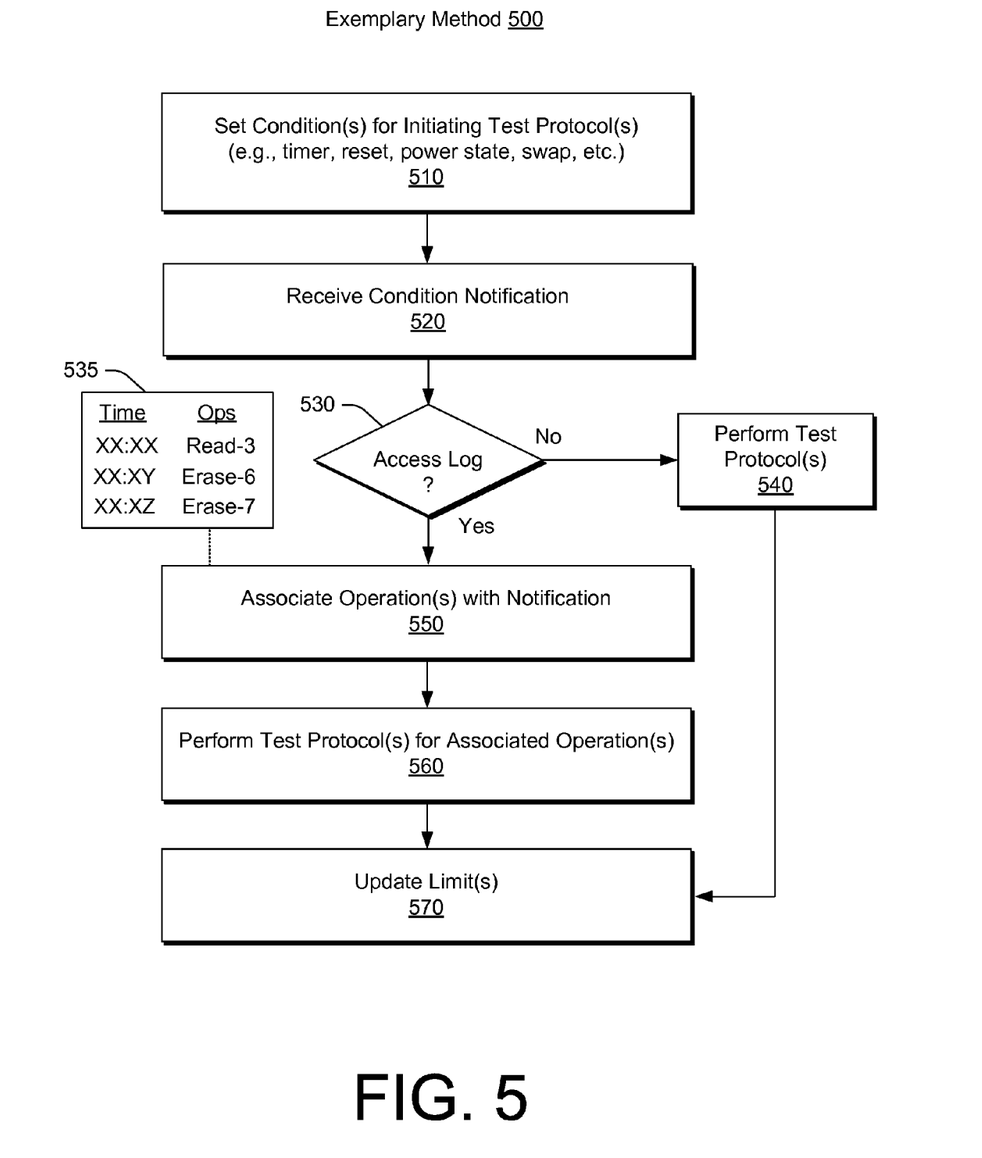
FIG. 5 is a diagram of an exemplary method for initiating one or more test protocols.

FIG. 5 shows an exemplary method 500 for updating one or more limits on memory operations. The method 500 commences in a set block 510 that sets one or more conditions for initiating a test protocol or test protocols. For example, if a reset occurs in response to memory operations, one or more test protocols may be initiated to set or update a limit or limits. In another example, a condition may be a timed condition. For example, a timed condition may call for initiating a test protocol every hour. As another example, consider a power state condition that initiates a test protocol (e.g., responsive to unplugging a device and switching to battery powered operation). In yet another example, a swap occurs for a removable solid-state memory (e.g., consider a swap to a larger capacity, more parallel solid-state memory that may introduce a risk of a higher instantaneous current drain).

After one or more conditions have been set, in a reception block 520 a condition notification is received that automatically initiates a test protocol or protocols. In the specific example of FIG. 5, the method 500 continues at a decision block 530 that decides whether a memory operations log should be accessed. If the decision block 530 decides to access the log, the method 500 continues at an association block 550; otherwise, the method 500 continues at a performance block 540 to perform one or more test protocols that correspond to the received condition notification of block 520.

In the example of FIG. 5, the solid-state memory has an associated log 535 that logs type of memory operation(s) in conjunction with a timestamp. As shown, the log 535 includes a listing and specific information as to the type of operation. According to the association block 550, the condition notification received in block 520 may include a timestamp that can be matched or otherwise associated with a timestamp in the log 535. After such an association is established, the method 500 continues to a performance block 560 that performs one or more test protocols for the associated memory operation(s) that gave rise to the received condition notification of block 520.

Whether the method 500 proceeds via a log access path or the non-log access path, one or more limits are updated in an update block 570. Accordingly, the method 500 can dynamically set or adjust one or more limits in an effort to avoid a reset due to a voltage droop.

Figure 6:
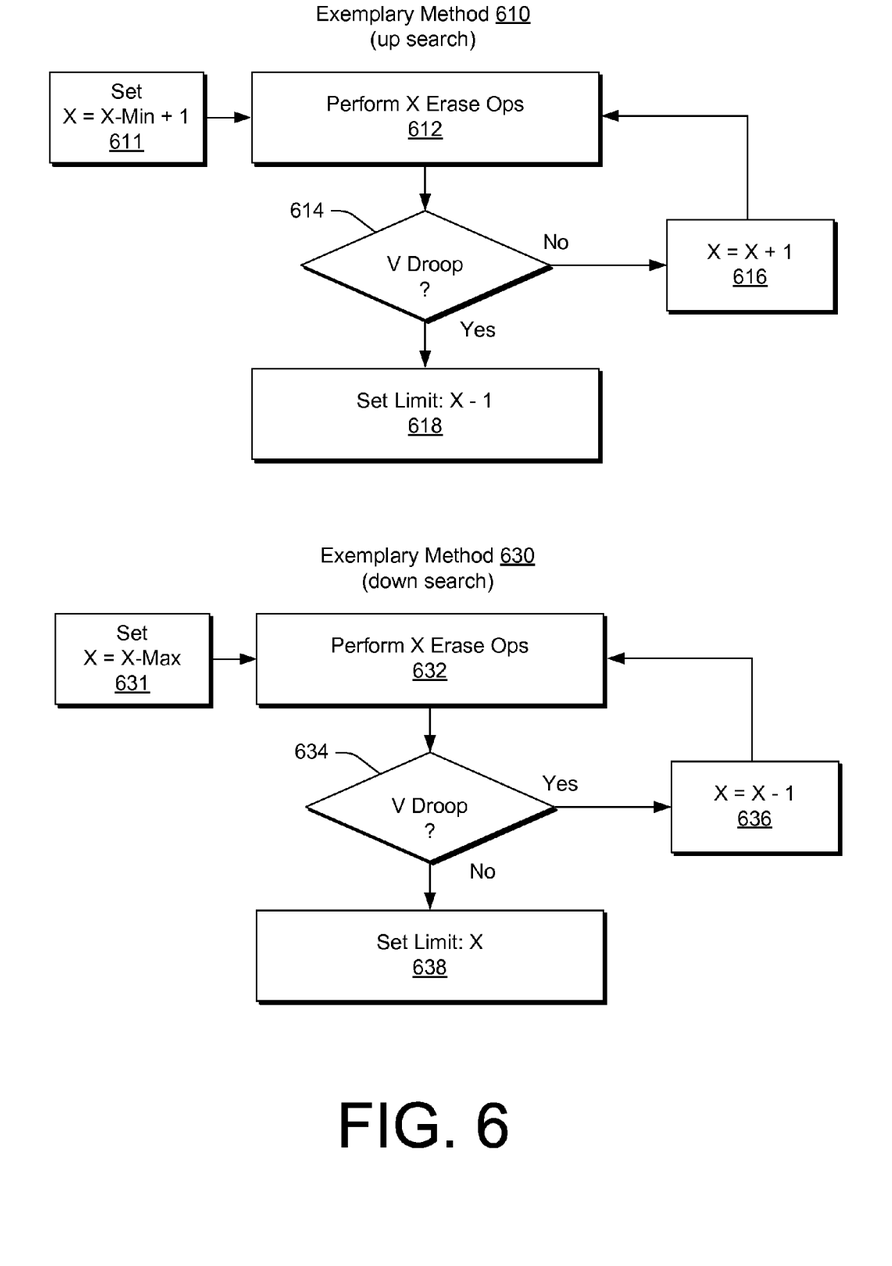
FIG. 6 is a diagram of an exemplary up search method and an exemplary down search method for setting a memory operation limit.

FIG. 6 shows an exemplary up search method 610 and an exemplary down search method 630. The up search method 610 commences in a set block 611 that sets an initial memory operation parameter X to X-Min+1, for example, where X may represent a number parallel channel, memory erase operations and X-Min a minimum acceptable number of memory erase operations (noting that X may alternatively correspond directly to a number of channels, a number of super pages, pages, sectors, etc.). After the set block 611, the method 610 continues at a performance block 612 that performs X erase operations. A decision block 614 decides whether an unacceptable droop in voltage occurred. If the decision block 614 decides that an unacceptable droop in voltage did not occur, then the method 610 continues at a block 616 that sets X=X+1, where "1" represents an incremental increase in the number of memory operations to be performed. However, if the decision block 614 decides that an unacceptable droop in voltage did occur, then the method 610 enters a set limit block 618 that sets a limit dependent on a value X−1, which may be equal to X-Min.

The down search method 630 commences in a set block 631 that sets an initial memory operation parameter X to X-Max, for example, where X may represent a number parallel channels memory erase operations and X-Max a maximum number of memory erase operations (noting that X may alternatively correspond directly to a number of channels). After the set block 631, the method 630 continues at a performance block 632 that performs X erase operations. A decision block 634 decides whether an unacceptable droop in voltage occurred. If the decision block 634 decides that an unacceptable droop in voltage did not occur, then the method 630 continues at a block 638 that sets a limit dependent on the value X, which may be equal to X-Max. However, if the decision block 634 decides that an unacceptable droop occurred in the voltage, the method 630 continues at a block 636 that sets X=X−1, where "1" represents an incremental decrease in the number of memory operations to be performed.

As described in the examples of FIG. 6, for the method 610, voltage monitoring circuitry to detect a droop in voltage is required to reach the set limit block 618; whereas, for the method 630, the set limit block 638 may be reached without voltage monitoring circuitry ever sensing a droop in voltage. An exemplary system may include instructions and associated circuitry to perform the method 610, the method 630, the methods 610 and 630 or hybrid types of up and down searches.

Referring again to the method 500 of FIG. 5, as described herein, a set condition may specify whether an up search or a down search (or combination thereof) should be performed. For example, if a reset condition occurs, then a down search may logically be appropriate; whereas, for a change in power state occurring due to, for example, removal of an external device, an up search may logically be appropriate to take advantage of any additional current draw that may be available. Of course, other types of power state changes may be more appropriately handled by a down search. Accordingly, relationships may exist between types of test protocols, conditions for initiating test protocols and types of searches to set or update one or more limits on memory operations.

Figure 7:
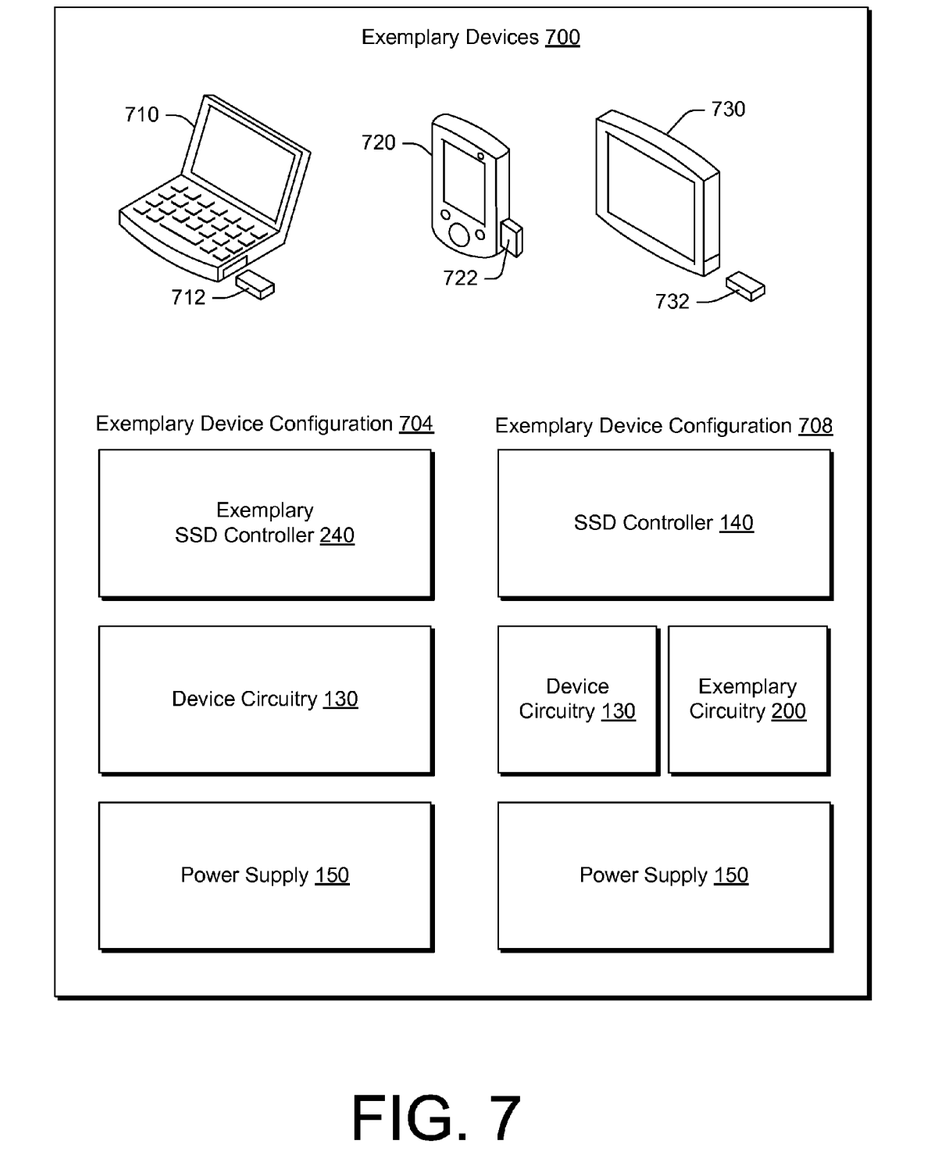
FIG. 7 is a diagram of exemplary devices or systems configured to manage memory operations.

FIG. 7 shows exemplary devices 700 and two exemplary device configurations 704, 708. The device 710 is a notebook computer with a SSD 712 that may be removable. The device 720 is a cell phone with a SSD 722 that may be removable. The device 730 is a media display device with a SSD 732 that may be removable (e.g., for displayable media).

As described herein, the devices 710, 720 and 730 may be configured in one or more manners to manage memory operations (e.g., to avoid current drain that could trigger a reset). As mentioned, FIG. 7 shows two possible exemplary configurations 704 and 708. The configuration 704 includes the exemplary SSD controller 240 of FIG. 2 and the device circuitry 130 and the power supply 150 of FIG. 1. In contrast, the configuration 708 includes the SSD controller 140 and the power supply 150 of FIG. 1 and the exemplary circuitry 200 of FIG. 2. Accordingly, if one of the devices 710, 720 or 730 is configured according to the configuration 708, that device can manage memory operations of the conventional SSD controller 140. With respect to the configuration 704, such a configuration relies on the SSD controller 240 and not the device. In an alternative configuration, a device may include the exemplary circuitry 200 and the exemplary SSD controller 240.

With respect to the devices 700, the configuration 704 may occur simply based on an upgrade of an existing SSD to an exemplary SSD with the SSD controller 240. In contrast, the configuration 708 may be a built-in feature of one of the devices 700. In yet another arrangement, some circuitry may exist on a device and other cooperative circuitry in a SSD; noting that such an arrangement may require pairing device and SSD features for compatibility and achieving operational objectives.

With respect to the device 730, consider a portable movie player where movie data exists on the SSD 732. Depending on the power supply of the device 730, full HD movies may risk a reset, which could be detrimental to a users viewing experience. Accordingly, an exemplary method may set a limit that causes display of a movie in less than a full resolution to thereby avoid parallel memory operations that could trigger a reset. Such an approach may be achieved where two versions of the movie exist on the SSD 732 or where less than all of the full resolution data on the SSD 732 is accessed by the device 730 or rendered by a rendering circuit of the device 730.

As described herein, various technologies can address issues arising from accessing memory chips in parallel, where power draw increases with the number of chips accessed. Such an issue not necessarily one of battery life because, even though more power is drawn, tasks get accomplished more quickly, which can allow a SSD to spend a greater percentage of its time in one or more low power states. Accordingly, given an overall workload, the power consumption across that workload may not necessarily be effected highly by an increase in parallelism. As discussed herein, an issue can arise with respect to instantaneous current draw and a questionable ability to be able to source the total current draw from a particular power source.

While various techniques exist to reduce power usage of SSDs (consider, e.g., the "Advanced Power Management Feature" set in ATA), such techniques require host interaction to set an appropriate power modes for the device and do not readily address reset issues due to a focus on power consumption over time not instantaneous power draw characteristic of parallel memory operations; noting that such techniques may be optionally implemented in conjunction with various exemplary techniques described herein.

In general, most SSDs have the capability to control how many concurrent operations they allow as well as the number of NAND chips that are allowed to be active at a given time.

As described herein, various exemplary methods, circuitry, etc., can set or limit such operations to reduce risk of reset. An exemplary method may initiate a protocol to set one or more limits responsive to a power-on of an SSD drive (e.g., where the SSD drive would go into a momentary test mode where to activate various types of concurrent operations). As explained, while performing such operations, a voltage comparator or other circuitry can determine whether a droop in the voltage supply line occurs. If a droop in the voltage line occurs, instructions can call for a reduction in number of concurrent operations of a test, perform the test and monitor the voltage line again until no unacceptable issue appears with the power supply. Once it is determined that the voltage supply is sufficient, the SSD can be limited to only allow a predetermined number of concurrent operations as being supported by the power supply (e.g., at a given time). While such an approach may reduce performance, it, in turn, allows a SSD to operate with reduced risk of reset in most types of systems, regardless of the power supply instantaneous current capabilities of a system.

As described herein, an exemplary system includes a power supply; a voltage monitoring circuit to monitor power supply voltage; multiple channels for controlling flash memory; and control circuitry configured to request flash memory operations via one or more of the multiple channels, to monitor power supply voltage via the voltage monitoring circuit during the request and to set a limit for subsequent flash memory operations requests based at least on the monitored power supply voltage. Such a system may include control circuitry configured to request one or more operations selected from a group of operations that includes erase operations, write operations and read operations. As mentioned, a system may include control circuitry configured to set a limit responsive to a decrease in power supply voltage, to set a limit for avoiding a flash memory reset operation responsive to a current drain caused by flash memory operations, etc.

As described herein, various acts, steps, etc., can be implemented as instructions stored in one or more computer-readable media. For example, one or more exemplary computer-readable media can include computer-executable instructions to instruct a processor to: control flash memory operations; to receive a signal from a voltage monitor as being associated with the controlled flash memory operations; and, based at least in part on the received signal, to set a limit for control of subsequent flash memory operations. Such media may optionally be SSD controller firmware.

The term "circuit" or "circuitry" is used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions.

Figure 8:
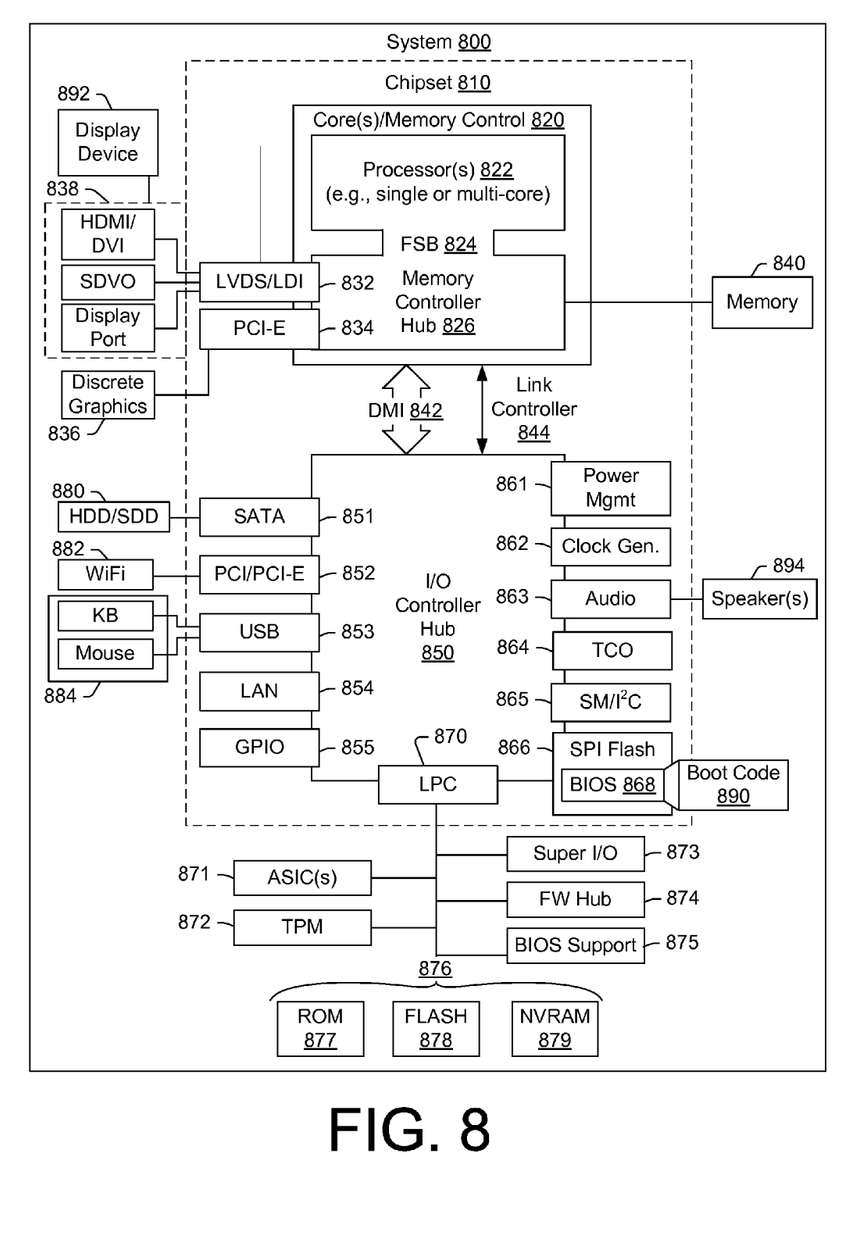
FIG. 8 is a diagram of an exemplary machine, which may be a client device, a server or other apparatus.

While various exemplary circuits or circuitry have been discussed, FIG. 8 depicts a block diagram of an illustrative exemplary computer system 800. The system 800 may be a desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a device, a client device, a server or other machine may include other features or only some of the features of the system 800 (see, e.g., the devices of FIG. 7).

As shown in FIG. 8, the system 800 includes a so-called chipset 810. A chipset refers to a group of integrated circuits, or chips, that are designed to work together. Chipsets are usually marketed as a single product (e.g., consider chipsets marketed under the brands INTEL®, AMD®, etc.).

In the example of FIG. 8, the chipset 810 has a particular architecture, which may vary to some extent depending on brand or manufacturer. The architecture of the chipset 810 includes a core and memory control group 820 and an I/O controller hub 850 that exchange information (e.g., data, signals, commands, etc.) via, for example, a direct management interface or direct media interface (DMI) 842 or a link controller 844. In the example of FIG. 8, the DMI 842 is a chip-to-chip interface (sometimes referred to as being a link between a "northbridge" and a "southbridge").

The core and memory control group 820 include one or more processors 822 (e.g., single core or multi-core) and a memory controller hub 826 that exchange information via a front side bus (FSB) 824. As described herein, various components of the core and memory control group 820 may be integrated onto a single processor die, for example, to make a chip that supplants the conventional "northbridge" style architecture.

The memory controller hub 826 interfaces with memory 840. For example, the memory controller hub 826 may provide support for DDR SDRAM memory (e.g., DDR, DDR2, DDR3, etc.). In general, the memory 840 is a type of random-access memory (RAM). It is often referred to as "system memory".

The memory controller hub 826 further includes a low-voltage differential signaling interface (LVDS) 832. The LVDS 832 may be a so-called LVDS Display Interface (LDI) for support of a display device 892 (e.g., a CRT, a flat panel, a projector, etc.). A block 838 includes some examples of technologies that may be supported via the LVDS interface 832 (e.g., serial digital video, HDMI/DVI, display port). The memory controller hub 826 also includes one or more PCI-express interfaces (PCI-E) 834, for example, for support of discrete graphics 836. Discrete graphics using a PCI-E interface has become an alternative approach to an accelerated graphics port (AGP). For example, the memory controller hub 826 may include a 16-lane (x16) PCI-E port for an external PCI-E-based graphics card. An exemplary system may include AGP or PCI-E for support of graphics.

The I/O hub controller 850 includes a variety of interfaces. The example of FIG. 8 includes a SATA interface 851, one or more PCI-E interfaces 852 (optionally one or more legacy PCI interfaces), one or more USB interfaces 853, a LAN interface 854 (more generally a network interface), a general purpose I/O interface (GPIO) 855, a low-pin count (LPC) interface 870, a power management interface 861, a clock generator interface 862, an audio interface 863 (e.g., for speakers 894), a total cost of operation (TCO) interface 864, a system management bus interface (e.g., a multi-master serial computer bus interface) 865, and a serial peripheral flash memory/controller interface (SPI Flash) 866, which, in the example of FIG. 8, includes BIOS 868 and boot code 890. With respect to network connections, the I/O hub controller 850 may include integrated gigabit Ethernet controller lines multiplexed with a PCI-E interface port. Other network features may operate independent of a PCI-E interface.

The interfaces of the I/O hub controller 850 provide for communication with various devices, networks, etc. For example, the SATA interface 851 provides for erasing, reading and writing information on one or more drives 880 such as HDDs, SDDs or a combination thereof. Accordingly, an exemplary SSD (see, e.g., controller 240 and memory 144 of FIG. 2) may be operably connected to the system 800 via such an interface. The I/O hub controller 850 may also include an advanced host controller interface (AHCI) to support one or more drives 880. The PCI-E interface 852 allows for wireless connections 882 to devices, networks, etc. The USB interface 853 provides for input devices 884 such as keyboards (KB), mice and various other devices (e.g., cameras, phones, storage, media players, etc.).

In the example of FIG. 8, the LPC interface 870 provides for use of one or more ASICs 871, a trusted platform module (TPM) 872, a super I/O 873, a firmware hub 874, BIOS support 875 as well as various types of memory 876 such as ROM 877, Flash 878, and non-volatile RAM (NVRAM) 879. With respect to the TPM 872, this module may be in the form of a chip that can be used to authenticate software and hardware devices. For example, a TPM may be capable of performing platform authentication and may be used to verify that a system seeking access is the expected system.

The system 800, upon power on, may be configured to execute boot code 890 for the BIOS 868, as stored within the SPI Flash 866, and thereafter processes data under the control of one or more operating systems and application software (e.g., stored in system memory 840). An operating system may be stored in any of a variety of locations and accessed, for example, according to instructions of the BIOS 868. Again, as described herein, an exemplary client device or other machine may include fewer or more features than shown in the system 800 of FIG. 8.

CONCLUSION

Although exemplary methods, devices, systems, etc., have been described in language specific to structural features and/or methodological acts, it is to be understood that the subject matter defined in the appended claims is not necessarily limited to the specific features or acts described. Rather, the specific features and acts are disclosed as exemplary forms of implementing the claimed methods, devices, systems, etc.

The invention claimed is:

1. A method comprising:
receiving electrical power from a host device to power a flash memory controller that comprises a voltage monitor and memory and that controls flash memory;
storing data received from the host device in the memory;
performing concurrent multi-channel flash memory controller operations that comprise concurrent multi-channel flash memory controller operations for writing the data from the memory to the flash memory;
receiving a signal from the voltage monitor as being associated with the performed concurrent multi-channel flash memory controller operations and the received electrical power from the host device; and
based at least in part on the received signal, setting a flash memory controller limit for performing subsequent concurrent multi-channel flash memory controller operations wherein the limit is set to avoid resetting of the flash memory responsive to current demand for performing the subsequent concurrent multi-channel flash memory controller operations.

2. The method of claim 1 wherein the receiving receives a signal that indicates a decrease in voltage occurred during the performed concurrent multi-channel flash memory controller operations.

3. The method of claim 1 wherein the concurrent multi-channel flash memory controller operations further comprise one or more memory operations selected from a group consisting of erase operations and read operations.

4. The method of claim 1 further comprising accessing one or more test protocols prior to the performing the concurrent multi-channel flash memory controller operations.

5. The method of claim 1 further comprising accessing a log of flash memory operations prior to the performing the concurrent multi-channel flash memory controller operations.

6. The method of claim 1 wherein the receiving a signal comprises receiving a digital signal representative of a percentage difference between an acceptable voltage and an unacceptable voltage.

7. The method of claim 1 further comprising repeating the method responsive to an event.

8. The method of claim 7 wherein the event comprises a flash memory reset event.

9. The method of claim 7 wherein the event comprises a timed event.

10. A system comprising:
   a power supply interface that receives power from a host device;
   a data interface that receives data from the host device and that transmits of data to the host device;
   a voltage monitoring circuit that monitors a power supply voltage based on power supplied by the host device via the power supply interface;
   multiple channels that controls flash memory; and
   control circuitry that requests concurrent flash memory operations via the multiple channels, that monitors the power supply voltage via the voltage monitoring circuit during the request and that sets a limit for subsequent concurrent flash memory operations requests via the multiple channels based at least on the monitored power supply voltage wherein the control circuitry that sets a limit comprises control circuitry that sets a limit that avoids a flash memory reset operation responsive to a current drain caused by the concurrent flash memory operations via the multiple channels.

11. The system of claim 10 wherein the control circuitry that requests concurrent flash memory operations via the multiple channels comprises control circuitry that requests one or more types of operations selected from a group consisting of erase operations, write operations and read operations.

12. The system of claim 10 wherein the control circuitry that sets a limit comprises control circuitry that sets a limit responsive to a decrease in power supply voltage.

13. One or more non-transitory computer-readable storage media comprising processor-executable solid-state drive controller firmware instructions to instruct a processor of a solid-state drive controller wherein the instructions comprise instructions:
   to control concurrent multi-channel flash memory operations;
   to receive a signal from a voltage monitor of the solid-state drive controller as being associated with the controlled concurrent multi-channel flash memory operations and power supplied via a power supply interface of the solid-state drive controller;
   based at least in part on the received signal, to set a limit for control of subsequent concurrent multi-channel flash memory operations wherein the limit is set to avoid resetting of flash memory responsive to current demand for performing the subsequent concurrent multi-channel flash memory controller operations; and
   to update the limit in response to a change in power state at the power supply interface of the solid-state drive controller.

* * * * *